United States Patent [19]
Wiesbauer

[11] Patent Number: 5,959,562
[45] Date of Patent: Sep. 28, 1999

[54] SIGMA-DELTA MODULATOR AND METHOD FOR OPERATING SUCH MODULATOR

[75] Inventor: Andreas Wiesbauer, Hoehnart, Austria

[73] Assignee: Analog Devices, Inc., Norwood, Mass.

[21] Appl. No.: 08/923,385

[22] Filed: Sep. 3, 1997

[51] Int. Cl.⁶ .................................................. H03M 3/00
[52] U.S. Cl. ............................................................ 341/143
[58] Field of Search .................................. 341/143, 131, 341/120, 155

[56] References Cited

U.S. PATENT DOCUMENTS 4,996,530   2/1991   Hilton ..................................... 341/120

OTHER PUBLICATIONS

"On–Line Digital Compensation of Analog Circuit Imperfections for Cascaded ΔΣModulators", Aug. 20, 1997 Wiesbauer et al.

Abdennadher et al., "Adaptive SelfCalibrating Delta–Sigma Modulators", Electronic Letters, Jul. 2, 1992, vol. 28, No. 14, p. 1288.

Wiesbauer et al., On–Line Digital Compensation of Analog Circuit Imperfections for Cacasded ΣΔModulators IEEE–CAS region 8 Workshop in Pavia, Sep. 13, 1996.

Morche et al., "A New Multistage Bandpass Sigma–Delta Modulator", 1996 IEEE International Symposium on Circuits and Systems, May 12–15, 1996.

Davis, "A MASH modulator with Digital Correction for Amplifier Finite Gain Effects and C–Ratio Matching Errors", IEEE Circuits & Syst. Soc Conference, Aug. 3–6, 1997.

Cauwenberghs et al., "Adaptive Calibration of Multiple Quantization Oversampled A/D Converters", IEEE, May 12–15, 1996.

Yang et al., "On–Line Adaptive Digital Correction of Dual–Quantisation Delta–Sigma Modulators", Electronics Letters, vol. 28, No. 16, pcp. 1511–15c13, Jul. 30, 1992.

(List continued on next page.)

Primary Examiner—Brian Young
Attorney, Agent, or Firm—Fish & Richardson P.C.

[57] ABSTRACT

A method and system for quantizing an analog input signal. The method includes the step of concurrently feeding an input signal and a test signal to the sigma-delta modulator. The modulator provides a common filter for a composite signal comprising the test signal and quantization noise generated in the modulator. The modulator thus produces an output signal comprising a quantized input signal and the commonly filtered composite signal. The modulator output signal is fed to an adaptive quantization noise canceler. The adaptive quantization noise canceler combines the modulator output signal with a quantization noise nulling signal to produce a quantization noise compensated output signal. The quantization noise nulling signal is produced by detecting the test signal component in the quantization noise compensated output signal and modifying the composite signal, also fed to the adaptive quantization noise canceler, in accordance with detected test signal in a feedback loop which nulls the test signal component in the quantization noise compensated output signal. With such an arrangement, because the quantization noise component has been commonly filtered with the test signal, modifying the composite signal in accordance with detected test signal to null the test signal component in the quantization noise compensated output signal also cancels the quantization noise component in the quantization noise compensated output signal.

14 Claims, 7 Drawing Sheets

OTHER PUBLICATIONS

Kiaei et al., "Adaptive Digital Correction For Dual Quantization Σ–ΔModulators", 1993 IEEE International Symposium on Circuits and Systems, pp. 1228–1230, vol. 2, May 1993.

Wiesbauer et al, "Adaptive Digital Compensation of Analog Circuit Imperfections for Cascade ΣΔModulators", 30th Asilomar Conference on Signals, Systems & Computers, Nov. 3–6, 1996.

Wiesbauer et al., "On–Line Digital Compensation of Analog Circuit Imperfections for Cascaded ΔΣ–Modulators", Jul. 15, 1997.

Temes, "Adaptive Digital Compensation of Analog Circuit Imperfection for Direct Conversion Receivers and A/D Converters", Jul. 1997.

Tmes, Adaptive Compensation of Analog Circuit Imperfection for Direct Down–Conversion Receivers and A/D Converters, Sep. 1997.

SIGMA-DELTA MODULATOR AND METHOD FOR OPERATING SUCH MODULATOR

BACKGROUND OF THE INVENTION

This invention relates generally to sigma-delta modulators and more particularly to sigma-delta modulators having compensation for analog circuit imperfections.

As is know in the art, one type of analog to digital converter (ADC) uses a sigma-delta modulator to convert an analog signal into a corresponding digital signal. Such modulator includes: a feedback loop filter fed by the input signal and the output signal produced by the modulator; and, a quantizer fed by the feedback loop filter to produce the modulator output signal. The feedback loop filter samples the analog signal at a rate (i.e., sampling frequency, $f_s$) greater than the Nyquist sampling rate, to thereby oversample the analog signal, and the majority of any resulting quantization noise produced by the quantizer is shifted in frequency (i.e., shaped) to a band greater than the bandwidth of the analog signal. The ratio of the sampling frequency, or rate, $f_s$, to the Nyquist rate is referred to as the oversampling ratio, OSR. The frequency spectrum of the output signal, $v_o$, is shown in FIG. 1 to include, in the "in-band" portion of the frequency spectrum, the frequency components primarily associated with the analog signal, and in the "out-of-band" portion of the frequency spectrum, primarily the shaped quantization noise. The frequency shifted (i.e., shaped) quantization noise is then reduced by a digital filter fed by the modulator output which produces digital words representative of the analog input signal. The digital words are produced at an output frequency, $f_{OUT}$, much less than the sampling rate, $f_s$. A sigma-delta ADC 10 is shown in FIG. 1 to include: (1) a sigma-delta modulator 11, having a feedback loop filter 12, quantizer 14, a digital to analog converter (DAC) 16; and (2) a digital decimation filter 18.

A multi-stage (i.e., cascade) sigma-delta modulator ADC 20 is shown in FIG. 2A to include a modulator system 22 and the digital decimation filter 18. The modulator system 22 includes the sigma-delta modulator 11 described in FIG. 1, an analog to digital converter (ADC) 26, and a quantization noise canceler 28 fed by the sigma-delta modulator 11 and the ADC 26. As noted above in connection with FIG. 1, the output of the sigma-delta modulator 11 here has the "in-band" frequency components indicated in the low frequency portion of the spectrum. These components are primarily associated with the analog signal and the "out-of-band" frequency components are shown in the higher frequency portion of the spectrum and are primarily associated with the shaped quantization noise. For example, as shown in FIG. 2, the output signal, $V_o$, produced by the sigma-delta modulator is a composite signal which may be represented as U+HQ, where U is the component of the output signal associated with the analog input signal, (i.e., includes the "in-band" frequency components of the output signal, $V_o$), Q is the quantization noise, H is a function of the electrical characteristics of the modulator 11. More particularly, H is representative of the quantization noise transfer function shown in FIG. 1. It is noted in FIG. 1 that H is a high-pass filter rejecting the "in-band" quantization noise components. Thus, the shaped quantization noise component of the signal $V_o$ is represented as HQ. Thus, the output signal of the modulator 11 on line 35 may be represented as $V_o$=U+HQ.

Referring to FIG. 2A, a signal is produced at the output of the feedback loop filter 12 (i.e., on line 30) having as a component thereof the quantization noise, Q; here representative of the difference between the un-filtered (i.e., pre-filtered) quantization noise, Q and the filtered quantization noise, HQ. That is, the signal on line 30, $V'_1$, may be represented as U+Q(H−1). The signal on line 30 is digitized by the ADC 26 to thereby provide a digital signal $V_1$ which represents an estimate of the quantization noise, Q; more particularly, U+Q(H−1).

The quantization noise canceler 28 includes: a subtractor 32 fed by the ADC 26 (i.e., Q(H−1)+U) and the modulator 11 output signal, $V_o$=U+HQ, to produce an output signal which represents Q. The subtractor 32 output signal Q is fed to a digital filter 34. The transfer function of the digital filter 34 is an estimate, H', of the noise transfer function, H. The output of the digital filter 34 may be represented as H'Q, neglecting the effect of quantization error in ADC 26. The canceler 28 includes a second subtractor 36 fed by the output of the modulator 11, i.e., the signal $V_o$=U+HQ, and the output of the digital filter 36, H'Q, to produce a signal on line 37 which may be represented as U+Q(H−H'). Thus, if the noise transfer function, H, of the sigma-delta modulator is known, i.e., H=H'), the signals $V_o$ and $V_1$, are processed in the quantization noise canceler 28 to remove, i.e., cancel, the shaped quantization noise HQ from the composite signal $V_o$. The noise transfer function, H, is related to the electrical characteristics of the modulator 11. The modulator 11 typically includes analog components, such as an analog integrator (i.e., operational amplifier and feedback capacitor) and switched, sampling capacitors in the feedback loop filter 12, the electrical characteristics of which vary with temperature. Further, the modulators are fabricated as integrated circuits and therefore the electrical characteristics vary from chip to chip because of processing variations. Thus, while an estimate of H (i.e., H') is provided as a digital filter 34 in the quantization noise canceler 28, such estimate, H', is typically representative of the actual noise transfer function, H, at a nominal operating temperature statistically averaged over a range of the chips. However, because the quantization noise canceler 28 merely stores an "average" digital representation of H (i.e., H') which will not change with temperature or processing conditions, variations in the modulator 11 electrical characteristics will result in an error in the removal, i.e., cancellation, of the shaped quantization noise component of the composite signal, $V_o$. That is, a residual shaped quantization noise, Q(H−H'), will remain in the signal produced by the canceler 28 on line 37, where H is the actual noise transfer function and H' is the "average", estimated noise transfer function used by the digital cancellation filter.

Referring now to FIG. 2B, an alternative digital to analog converter 20a is shown. Here, modulation system 22a includes a quantization noise canceler 28a and an additional DAC 17 fed by the output of quantizer 14. The signal on line 30 and the output of DAC 17 are subtracted to produce a signal representative of the pre-filtered quantization noise, Q. The ADC 26 digitizes such signal to produce a digital signal representative of the pre-filter quantization noise, Q. Thus, the filter 34, which is fed by the ADC 26 produces an output signal H'Q, as in the system 22 of FIG. 2A. Thus, as in the system 22 in FIG, 2A, the signal produced at the output of the quantization noise canceler 28a may be represented as: U+Q(H−H'), where Q(H−H') represents any residual quantization noise resulting from errors in the estimate of H'.

Various techniques have been suggested to remove this residual error, Q(H−H'). Some of these techniques are reported in my papers entitled "On-Line Digital Compensation of Analog Circuit Imperfections for Cascaded ΣΔ Modulators" by A. Wiesbauer and G. C. Temes IEEE-CAS region 8 Workshop in Pavia, Sep. 13–14, 1996 and "Adaptive Digital Compensation of Analog Circuit Imperfections for Cascaded ΣΔ Modulators" by A. Wiesbauer and G. C. Temes, 30th Asilomar Conference on Signals, Systems, and Computer, Pacific Grove, Calif., Nov. 3–6, 1996, the entire subject matter of both papers being incorporated herein by reference.

SUMMARY OF THE INVENTION

In accordance with the present invention, a method and system are provided for operating a sigma-delta modulator. The method includes the step of feeding an input signal and a test signal to the sigma-delta modulator. The test signal and the input signal are fed to the modulator at a different points in the modulator. The modulator provides a common filter for a composite signal comprising the test signal and quantization noise generated in the modulator. The modulator thus produces an output signal comprising a quantized input signal and the commonly filtered composite signal. The modulator output signal is fed to an adaptive quantization noise canceler. The adaptive quantization noise canceler combines the modulator output signal with a quantization noise nulling signal to produce a quantization noise compensated output signal. The quantization noise nulling signal is produced by detecting the test signal component in the quantization noise compensated output signal and modifying the composite signal, also fed to the adaptive quantization noise canceler, in accordance with the detected test signal in a feedback loop which nulls the test signal component in the quantization noise compensated output signal.

With such an arrangement, because the quantization noise component has been commonly filtered with the test signal, modifying the composite signal in accordance with detected test signal to null the test signal component in the quantization noise compensated output signal also cancels the quantization noise component in the quantization noise compensated output signal.

In accordance with another feature of the invention, a method and system are provided for operating a sigma-delta modulator. The method includes the step of concurrently feeding an input signal and a test signal to the sigma-delta modulator to produce a modulator output signal. The modulator provides a common filter for a composite signal comprising the test signal and quantization noise generated in the modulator. The modulator output signal produced therefore includes as components thereof the quantized input signal and the filtered composite signal. An adaptive quantization noise canceler is provided for combining the modulator output signal and the pre-filtered composite signal to produce a quantization noise nulling signal. The quantization noise nulling signal is produced by detecting the test signal component in the quantization noise compensated output signal and modifying the composite signal, also fed to the adaptive quantization noise canceler, in accordance with the detected test signal in a feedback loop which nulls the test signal component in the quantization noise compensated output signal.

With such method and system, because the test signal and the quantization noise are formed as a composite signal and pass through common filtering provided by the modulator, detection of a characteristic of the test signal component in the quantization noise compensated output signal, such as the power in such test signal component, provides a measure of residual error between the actual electrical characteristics of the common filtering provided by the modulator to the composite signal and an estimate of the electrical characteristics of the modulator. This measure of residual error is used as a feedback control signal to adjust the filtering of the pre-filtered composite signal in a manner to null such residual error. To put it another way, because the test signal enters the modulator at the same node where the quantization error is generated (i.e., undergo common filtering by the modulator), nulling test signal power in the modulator output signal automatically, and concurrently, nulls quantization noise in such output signal. Thus, on-line digital compensation of errors resulting from using an estimate of the electrical characteristics of the filter which may change from analog circuit imperfections in fabricating the modulator as well as from environmental changes are removed.

In accordance with another feature of the invention, a sigma-delta modulation system is provided. The system includes a sigma-delta modulator concurrently fed by an input signal and a test signal to produce an output signal. The modulator providing a common filter for the test signal and quantization noise generated in the modulator in quantizing the input signal, such output signal comprising the quantized input signal and the commonly filtered quantization noise and test signal. An adaptive quantization noise canceler is provided for combining the quantization noise and test signal prior to filtering by the common filter with the modulator output signal to produce a quantization noise compensated output signal. The canceler combines the quantization noise and test signal prior to filtering by the common filter and the modulator output signal as a function of the power of the test signal in the quantization noise compensated output signal.

In accordance with still another feature of the invention, a sigma-delta modulation system is provided having a sigma-delta modulator adapted for coupling to an input signal and a test signal. Also provided is an adaptive quantization noise canceler fed by the modulator for canceling quantization noise generated in the modulator in accordance with test signal components in a quantization noise compensated output signal produced by the adaptive quantization noise canceler.

In one embodiment, the adaptive quantization noise canceler includes: an adaptive filter fed by the modulator; and, a test signal detector fed by the quantization noise compensated output signal. The characteristics of the adaptive filter are modified by the test signal detector to remove quantization noise from the modulator output signal.

BRIEF DESCRIPTION OF THE DRAWING

These and other features of the invention will become more readily apparent from the following detailed description taken together with the accompanying drawings, in which.

DETAILED DESCRIPTION

Figure 1:
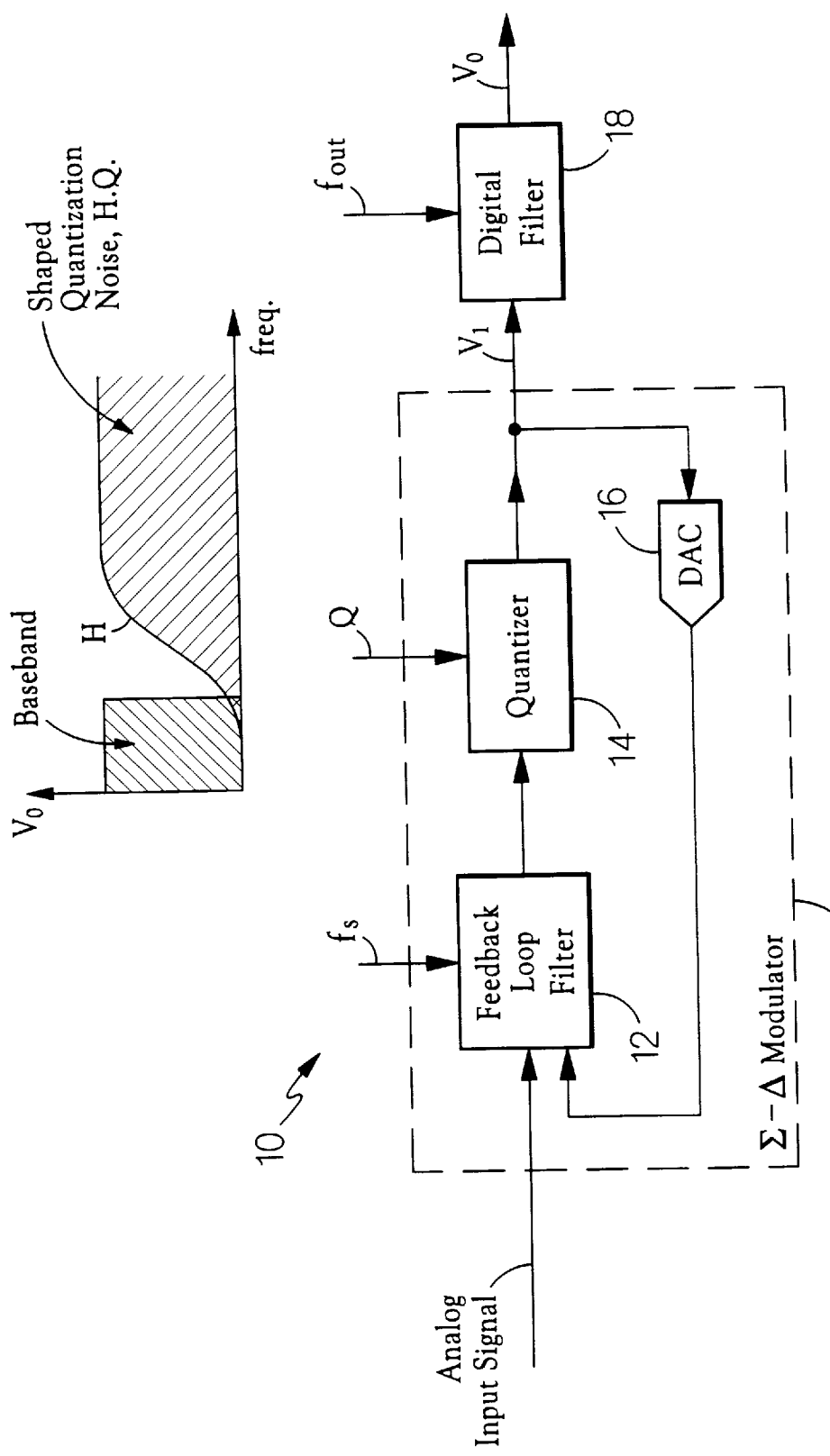
FIG. 1 is a block diagram of a sigma-delta analog to digital converter according to the PRIOR ART.
Figure 2A:
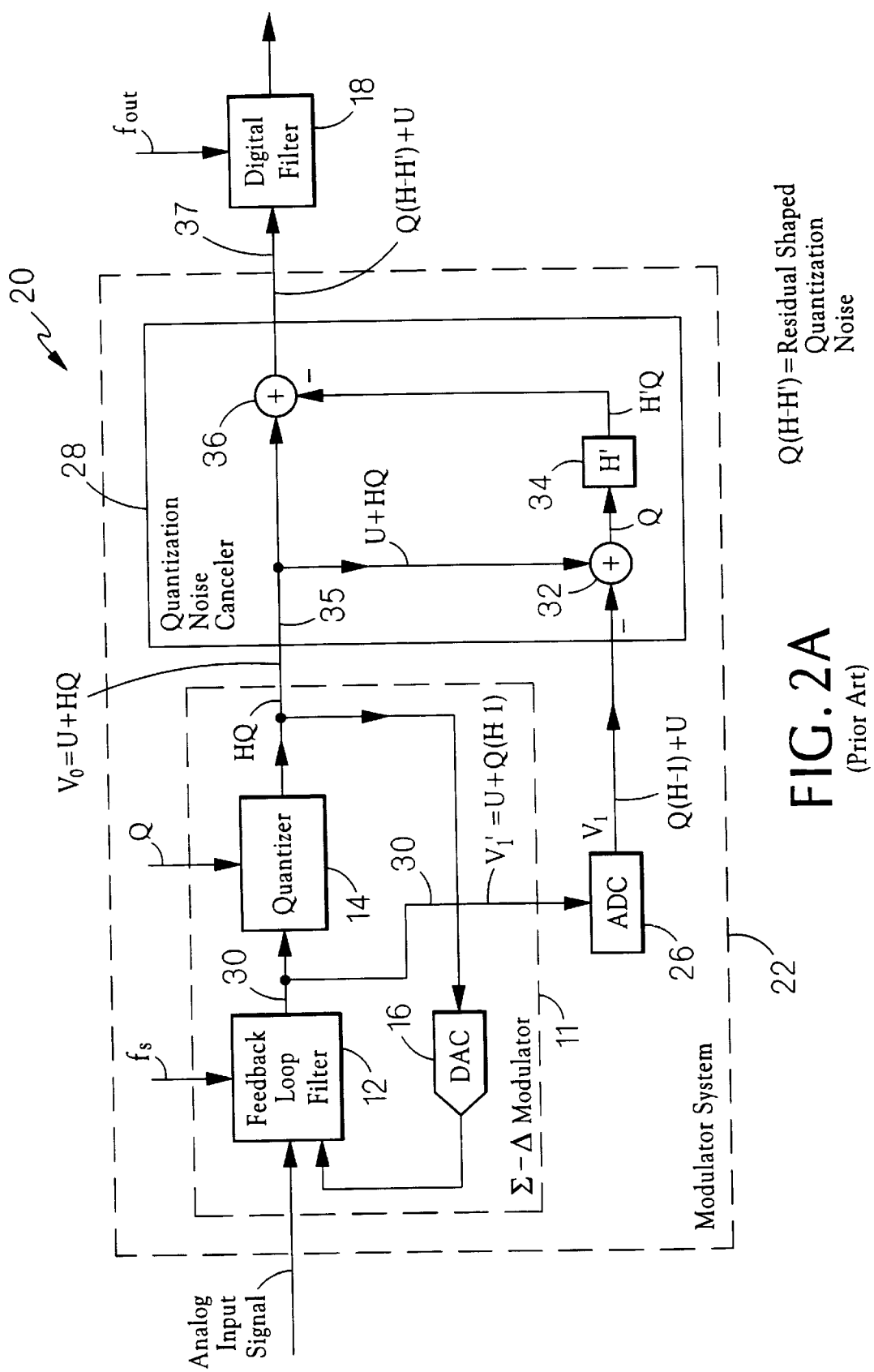
FIGS. 2A and 2B are block diagrams of multi-stage sigma-delta analog to digital converters according to the PRIOR ART.
Figure 2B:
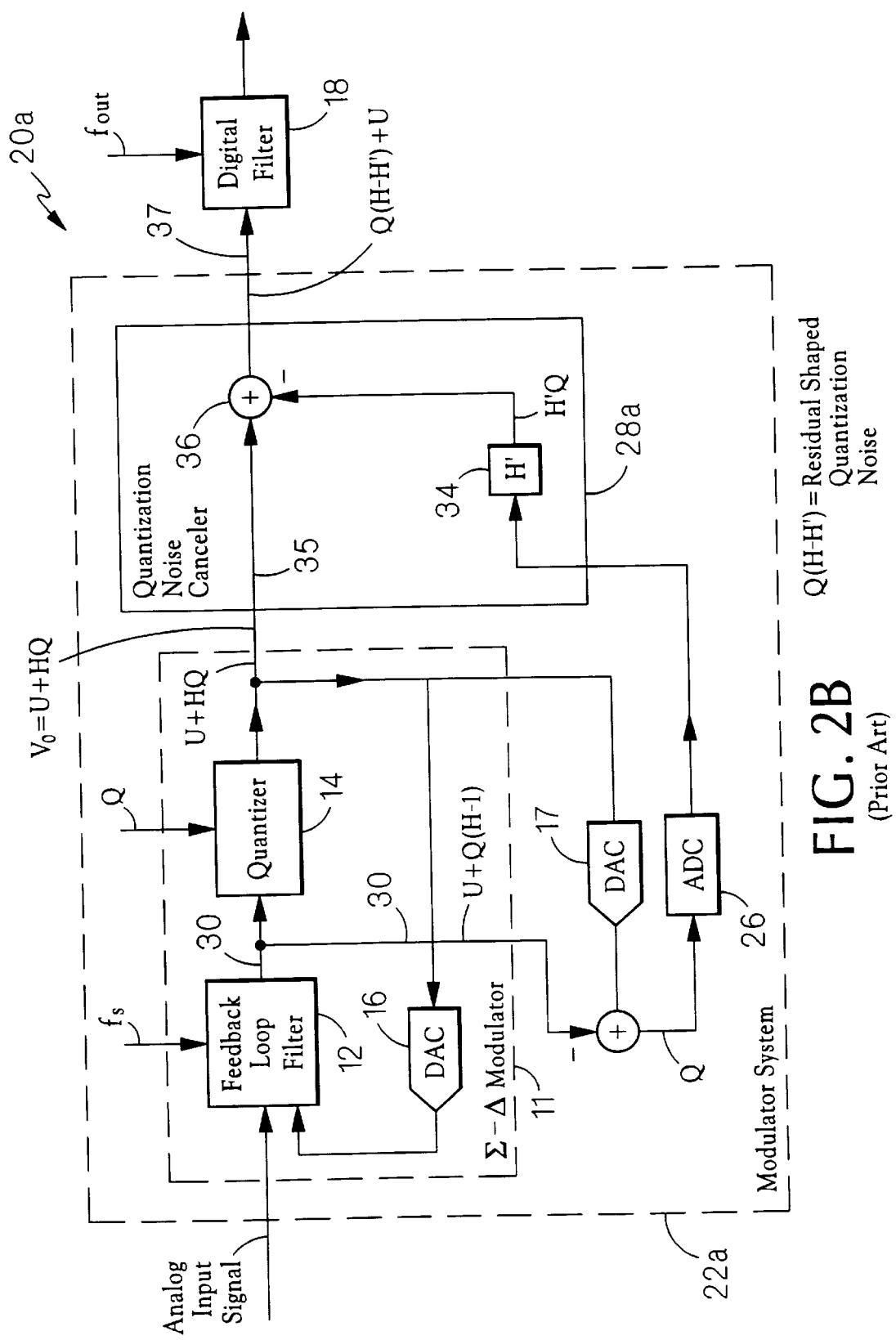
Figure 3A:
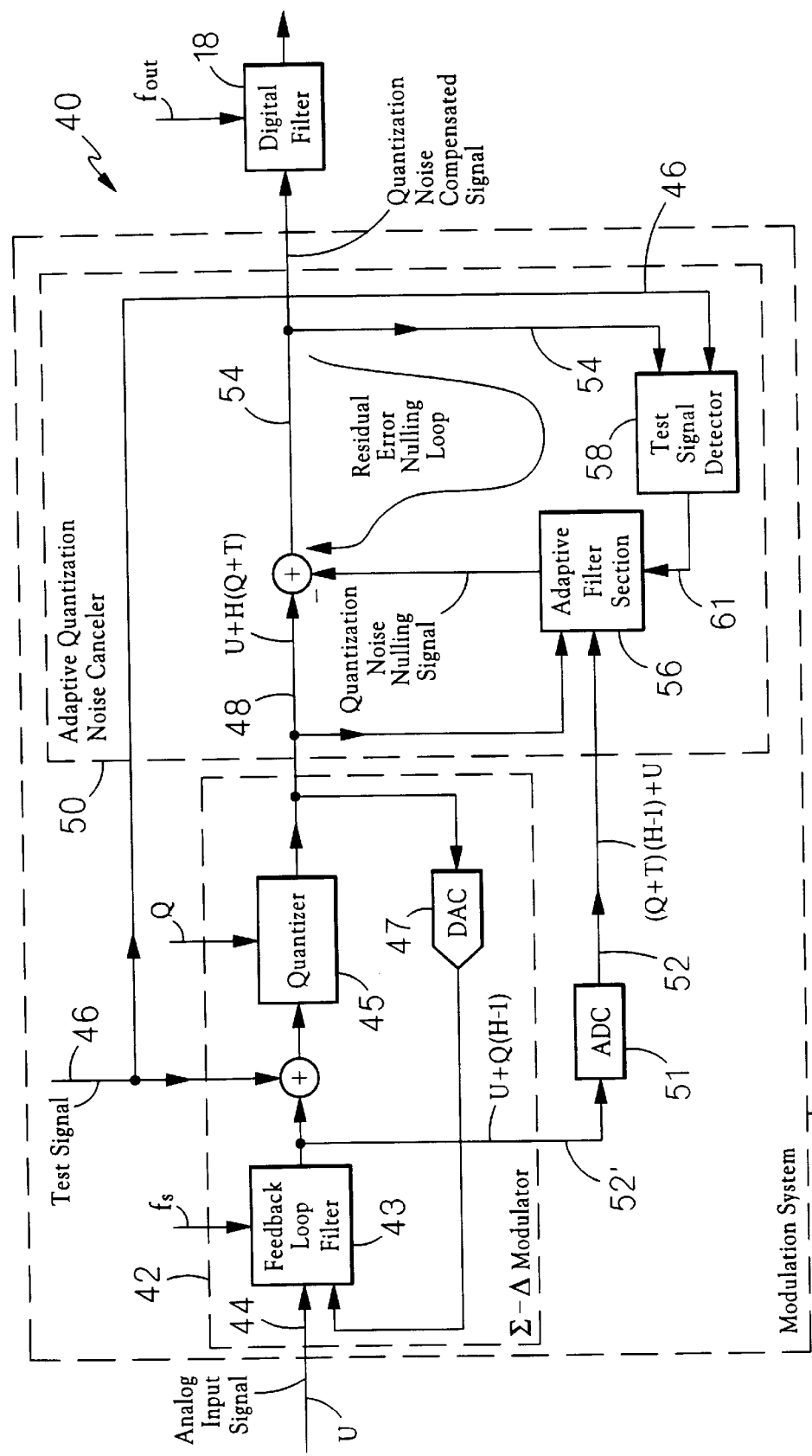
FIGS. 3A and 3B are block diagrams of sigma-delta analog to digital converters according to the invention.

Referring now to FIG. 3A, a multi-stage, here two-stage, cascaded sigma-delta analog to digital converter (ADC) 40 is shown. The ADC 40 includes a sigma-delta modulation system 41 concurrently fed by an analog input signal, U, on line 44 and a test signal, T, on line 46 and a decimation filter 18 to produce an output signal on line 54. The modulation system 41 includes a sigma-delta modulator 42, an ADC 51 and an adaptive quantization noise canceler 50. The modulator 42 includes a feedback filter 43, quantizer 45 and DAC 47 arranged as shown and provides a common filter, having a transfer function, H, for the test signal, T, fed thereto on line 46 and quantization noise, Q, generated in the quantizer 45 of modulator 42 in quantizing the analog input signal, u, on line 44. The feedback loop filter 43 samples the analog signal on line 44 at a rate greater than the Nyquist sampling rate, $f_s$, (i.e., oversamples the analog signal) and the majority of any resulting quantization noise produced by the quantizer 45, here represented by Q, is shifted in frequency (i.e., shaped) to a band outside the frequency band of the analog signal. This frequency shifted (i.e., "out-of-band") quantization noise is removed by digital decimation filter 18. Thus, the modulator 42 output signal on line 48 comprising the quantized input signal, U, and the commonly filtered quantization noise and test signal H(Q+T), where H, as noted above, is the noise transfer function of the modulator 42. The adaptive quantization noise canceler 50 is provided for combining the quantization noise and test signal, T, prior to filtering by the common filter, H, (i.e., a signal on line 52' after digitized by ADC 51 to a corresponding digital signal on bus 52) having a component thereof representative of a composite signal (T+Q), with the modulator 42 output signal on line 48 representative of U+H(Q+T) to produce a quantization noise compensated output signal on line 54. The adaptive quantization noise canceler 50 combines the composite quantization noise and test signal (T+Q) on line 52 prior to filtering by the common filter H provided by the modulator 42 and the modulator output signal on line 48 (i.e., U+H(T+Q)) as a function of the power of the test signal, T, component in the quantization noise compensated output signal on line 54.

More particularly, the adaptive quantization noise canceler 50 includes: an adaptive filter section 56 fed by the modulator 42 (i.e, the pre-filtered composite signal(T+Q) H−(T+Q)+U on bus 52); the signal U+H(Q+T) on line 48; and, a test signal detector 58 fed by the quantization noise compensated output signal on line 54 and the test signal on line 46. The characteristics of the adaptive filter section 56 are modified by the test signal detector 58 to remove quantization noise from the modulator output signal on line 54. Here, the test signal detector 58 may be any hardware which implements an adaptive algorithm, such as, for example a least means square (LMS) algorithm which may include a correlator or test signal demodulator. The test signal detector 58 is fed by the test signal, T, as a reference on line 46 to detect the test signal, T, component in the quantization noise compensated output signal on line 54. Because the quantization noise component, Q, has been commonly filtered with the test signal, T, modifying the composite signal (T+Q) on bus 52 in accordance with detected test signal component to cancel such test signal component also cancels the quantization noise component in the quantization noise compensated output signal. The signal component, U, on bus 52 is removed by the adaptive filter section 56.

Figure 3B:
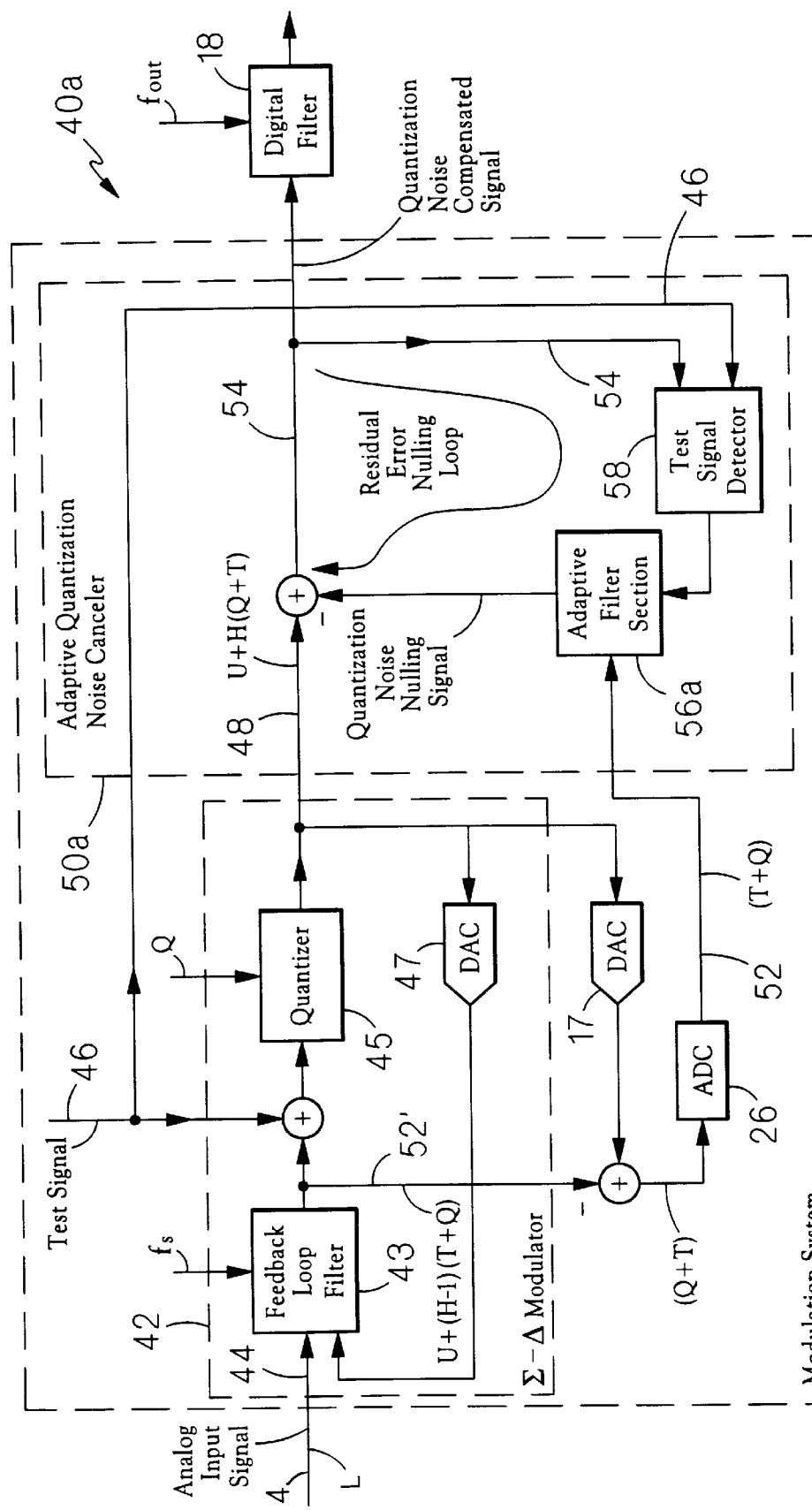

Referring briefly to FIG. 3B, an alternative modulation system 41a is shown. Here, a DAC 17 is provided for converting the signal produced on line 48 into a corresponding analog signal (i.e., U+H(T+Q)) which is subtracted from the signal on line 52', i.e., U+(H−1)(T+Q). The resulting signal, (T+Q) is converted into a corresponding digital signal, by ADC 26, which is fed to adaptive filter section 56a of the adaptive quantization noise canceler 50a, as shown. As with the modulation system 41 (FIG. 3A), a test signal detector 58 is fed by the quantization noise compensated output signal on line 54 and the test signal T on line 46. The characteristics of the adaptive filter section 56a are modified by the test signal detector 58 to remove quantization noise from the modulator output signal on line 54. Here, the test signal detector includes a correlator, or test signal demodulator fed by the test signal, T, on line 46 to detect the test signal, T, component in the quantization noise compensated output signal on line 54. Because the quantization noise component, Q, has been commonly filtered with the test signal, T, modifying the composite signal (T+Q) component on bus 52 in accordance with detected test signal component to cancel such test signal component also cancels the quantization noise component in the quantization noise compensated output signal.

Figure 4:
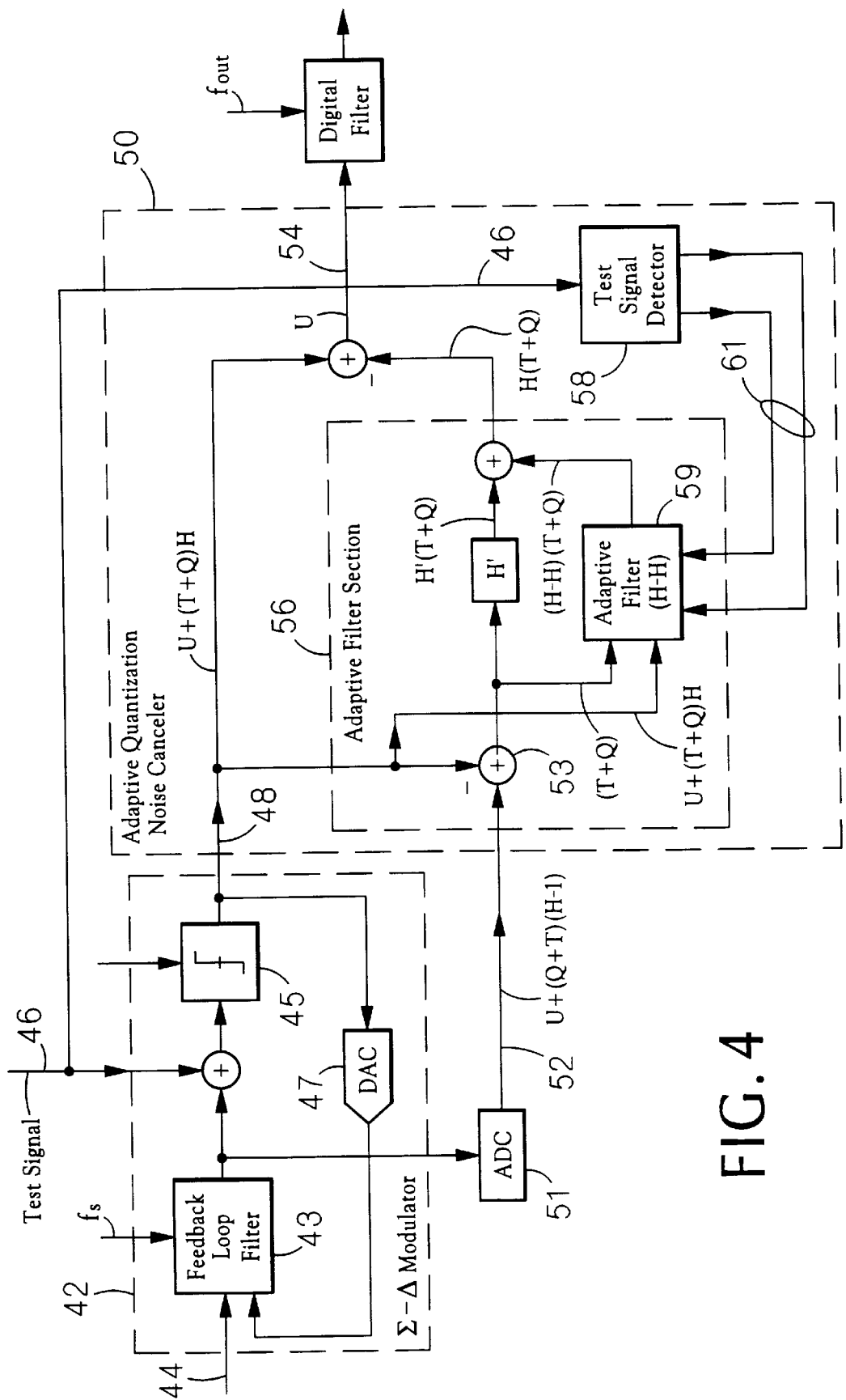
FIG. 4 is a more detailed block diagram of the sigma-delta analog to digital converter of FIG. 3A.

More particularly, referring to FIG. 4, a block diagram is shown to explain in more detail the operation of the modulation system 41 of FIG. 3A. Here, quantizer 45 is a one-bit quantizer and the DAC 47 is a one-bit digital to analog converter. As noted above, the signal produced by modulator 42 on line 48 may be represented as U+H(Q+T), assuming a quantizer gain of unity.

The ADC 51 is here a sigma-delta DAC having a multi-bit quantizer, it being understood that other types of ADCs may be used to convert the signal on line 52' to a corresponding digital signal on bus 52 representative of U+(T+Q)(H−1).

The modulation system 41 has an input adapted for receiving a test signal, T on line 46. The test signal, T, can be any signal uncorrelated with the input signal on line 44. Preferably the test signal, T, is a binary pseudo-random noise signal. The test signal is introduced into the modulator 42 at the same node, or point, where the quantization noise, Q, is generated in the modulator 42. Thus, the signal produced by the modulator on line 48 includes three components: a component, U, representative of the quantized analog input signal on line 44, the shaped quantization noise, HQ, where H represents the quantization noise transfer function of modulator 42, and a shaped test signal, HT, assuming here a unity quantizer gain. It is noted that because the test signal, T, is introduced into the modulator 42 at the same node the quantization noise, Q, is produced, the test signal, T, and the quantization noise Q, may be considered as a composite signal (Q+T) which is shaped, i.e., filtered by a common filter, H, provided by the modulator 42. Thus, the modulator 42 output signal on line 48 may be represented as: U+H(T+Q). The output of the ADC 51 may be represented as: (Q+T)(H−1)+U.

The multi-stage modulator system 41 includes the adaptive quantization noise canceler 50. The adaptive canceler 50 includes an adaptive filter section 56. Adaptive filter section 56 includes a filter having an estimate of the quantization noise transfer function, H', and an adaptive filter 59. The adaptive filter is fed by the output of a subtractor 53, the signal on line 48 and a test signal detector 58 output on bus 61. The output of the subtractor 53 may be represented by (T+Q), and the signal on line 48 may be represented as U+(T+Q)H. The operation of the adaptive filter 59 will be described in more detail in connection with FIG. 5. Suffice to say here, however, that the adaptive filter 59 transfer function is adaptively controlled, i.e, adjusted, by the digital word produced on bus 61 by the test signal detector 58 so that in the steady state the transfer function of adaptive filter 59 is (H−H'). In such a condition, the output of the adaptive filter 59 may be represented as: a residual error signal, $(T+Q)(H-H')$. The output of adaptive filter 59 is added to the output of the estimate filter H', (i.e., the signal $(T+Q)H'$), in an adder 65. Thus, the output of the adder 65 may be, in the steady state, represented as: $(T+Q)H$, the quantization noise nulling signal described above in connection with FIG. 3A. Thus, the output signal produced by the adaptive noise quantization canceler 50 on line 54 may, in the steady state, be represented by: the quantized analog input signal, U, where again the quantization noise of ADC 51 is neglected.

Thus, with such system and method, because the test signal, T, and the quantization noise, Q, are formed as a composite signal and pass through common filtering, H, provided by the modulator 42, detection of a characteristic of the test signal component in the quantization noise compensated output signal on line 54, such as the power in such test signal, T, component, provides a measure of residual error between the actual electrical characteristics of the common filtering provided by the modulator 42 to the composite signal and the estimate of the electrical characteristics of the modulator 42. This measure of residual error is used as a feedback control signal to adjust the filtering of the pre-filtered composite signal in a manner to null such residual error. To put it another way, because the test signal enters the modulator 42 at the same node where the quantization error is generated (i.e., undergo common filtering by the modulator) nulling test signal power in the modulator output signal automatically, and concurrently, nulls quantization noise in such output signal. Thus, on-line digital compensation removes errors resulting from using an estimate of the electrical characteristics of the filter which may change from analog circuit imperfections in fabricating the modulator as well as from environmental changes.

Figure 5:
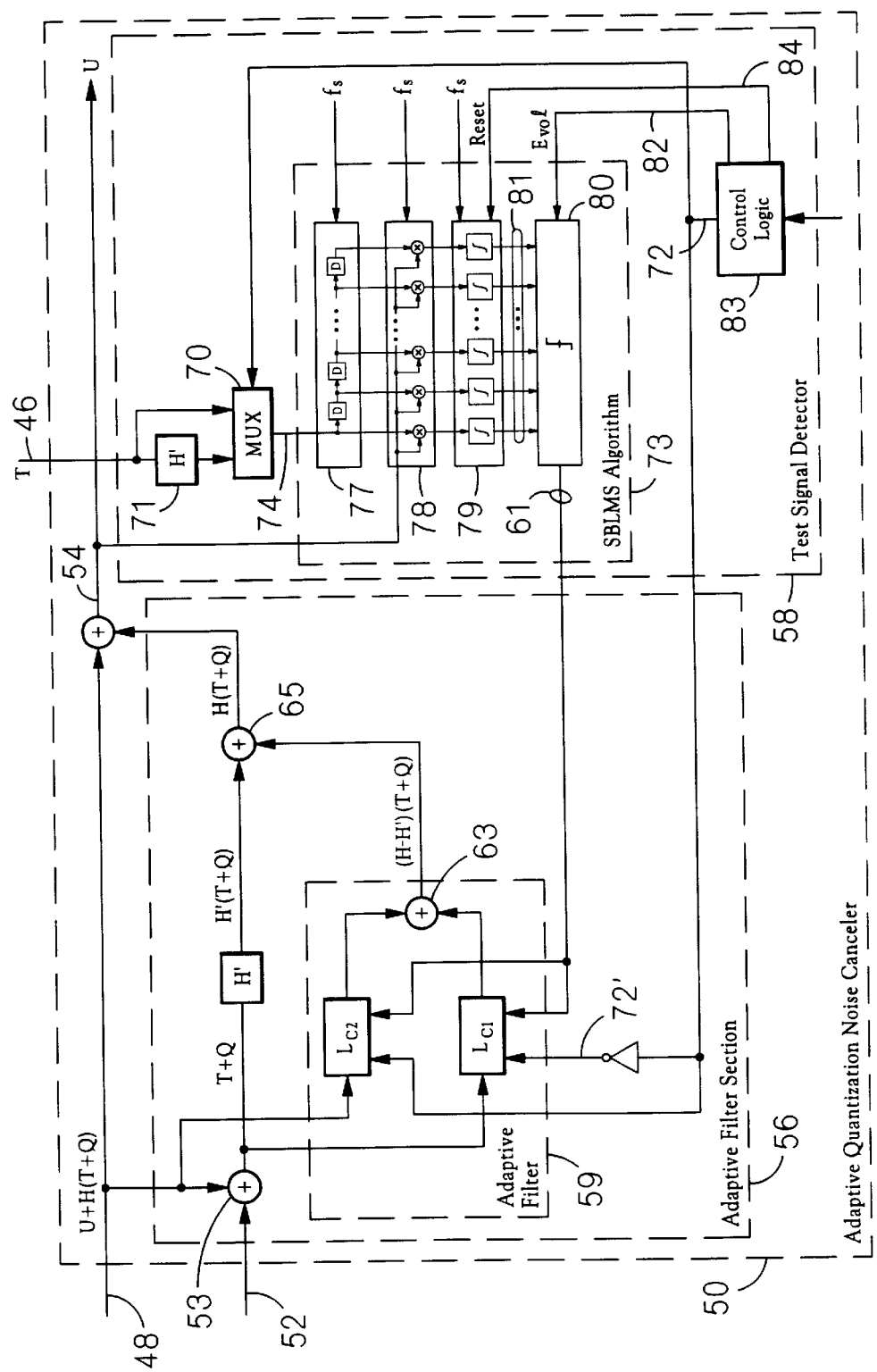
FIG. 5 is a more detailed block diagram of a adaptive quantization noise canceler used in the converter of FIG. 4.

Referring now to FIG. 5, the adaptive quantization noise canceler 50 of FIG. 4 is shown in more detail. The adaptive filter 59 includes a pair of adaptive filtering sections $L_{C1}$ and $L_{C2}$, here, for example, finite impulse response filters (F.I.R. filter) fed by the signals $U+H(T+Q)$ on line 48 and the signal $(T+Q)$ produced by subtractor 53, respectively, as shown, and an adder 63. The test signal detector 58 adaptively determines the coefficients of the filtering sections $L_{C1}$, and $L_{C2}$ such that the signal produced by the adder 63, after being combined with the signal produced by the estimate filter H' in adder 65 results in the quantization noise nulling signal described above.

The output of the adder 63 may be represented as: $L_{C2}\{H(T+Q)+U\}+L_{C1}\{T+Q\}$. which ideally should be $(H-H')(T+Q)$. Thus, $L_{C1}+HL_{C2}$ should ideally be $(H-H')$. The order of the transfer function of filtering section $L_{C1}$ may be as low as the order of modulator 42 noise transfer function, H, minus 1. Therefore $L_{C1}$ is typically a low order filter which is relatively inexpensive to implement in hardware. $L_{C1}$ removes low order components of $(H-H')(T+Q)$ whereas the filtering section $L_{C2}$ is of higher order than filtering section $L_{C1}$ and thus filtering section $L_{C2}$ removes higher order components of $(H-H')(T+Q)$. If the ADC 51 produces a one-bit quantized output signal, the filtering sections $L_{C1}$ and $L_{C2}$ may be combined into a single adaptive filter 59. If, however, ADC 51 produces a multi-bit output, the use of the second filtering section $L_{C2}$ simplifies hardware implementation because the input signal 48 to the filtering section $L_{C2}$ is a single bit signal and therefore $L_{C2}$ needs only adders instead of multipliers.

The test signal detector 58 may be any hardware which implements an adaptive algorithm to decorrelate the test signal 46 from the modulator output signal 48 in conjunction with the adaptive filters $L_{C1}$ and $L_{C2}$. In FIG. 5 we show, as an example, the implementation of a Sign Block Least Mean Square (SBLMS) algorithm for the test signal detector, where the adaptive filters $L_{C1}$ and $L_{C2}$ are FIR filters. The test signal detector 58 includes a multiplexer 70, having one input fed by such test signal, T, on line 46 and another input fed by such test signal, T, after passing through a filter 71 which has a transfer function equal to the estimate quantization noise transfer function, H', as shown. The multiplexer 70 is controlled by a clock signal fed thereto via line 72. The clock signal 72 switches between the adaptation of the filter $L_{C1}$ and $L_{C2}$, sharing a single implementation of an adaptive algorithm, the SBLMS algorithm 73. The SBLMS algorithm has two inputs, the reference-signal input on line 74 and the error-signal input connected to the modulator output 54. The output of the SBLMS algorithm is a binary signal-vector, bus 61, containing update information for the adaptive filter coefficients such that the power of the test-signal component in 54 is reduced. Each element of the signal vector 61 corresponds to one filter coefficient of the adaptive filter, either requiring an increase or reduction of the filter coefficient value by one LSB. Bus 61 is fed to both adaptive filters. Here the adaptive filters $L_{C1}$ and $L_{C2}$ are updated in an alternating pattern and the clock signal 72 pulses at a rate $f_s/N$, the adaptation frequency. During one half clock period of 72 the adaptation of the filter $L_{C1}$ is performed with the signal T coupled to the reference input 74 of the adaptation algorithm 73 via multiplexer 70 and the filter coefficients of $L_{C1}$ are updated at the end of the first half clock period according to the filter update information on bus 61 controlled by the signal 72', the inverted signal 72. During the next half clock period the output of filter 71, H'T, is coupled to the reference input 74 of the SBLMS algorithm 73 and the filter coefficients of $L_{C2}$ are updated according to the information on bus 61 with the clock signal 72. Thus, only one of the pair of the adaptive filters $L_{C1}$, $L_{C2}$ has the coefficients thereof adjusted during one half clock period; the other adaptive filter being held constant.

The SBLMS adaptive algorithm includes a chain of delays 77, an array of multipliers 78, an array of digital integrators 79 and an array of quantizers 80. The number of delays contained in 77 is equal to the highest order of the adaptive filter $L_{C1}$ or $L_{C2}$, termed L. L is typically smaller than 5, depending on the actual configuration as small as 3. The output of the integrator array, the signal vector on bus 81, represents an estimate of the gradient of the L-dimensional surface of the adaptation error (power of test-signal component in the modulator output signal 54) as a function of the L adaptive filter coefficient values. This information is obtained by correlating the modulator output signal 54 with delayed versions of the reference signal 74 in the multiplier section 78 and integrator section 79. In order to keep the update of the adaptive filters simple, the gradient estimate 81 is quantized to one bit in the quantizer array 80 before it is fed to the adaptive filters. Therefore the signals on bus 61 contain only information about the sign of each component of the gradient estimate and the coefficient update in the adaptive filters can be performed with simple up-down counters instead of adders. Shortly before the end of each half clock period of 72 the quantizers evaluate the input vector 81 to generate the new adaptive filter update vector 61, controlled by the evaluation signal 82 generated in the control logic 83 which also provides the adaptation clock signal 72. After the evaluation is performed, integrators 79 are reset to zero by the control signal 82, thereby not changing the signals on bus 75, and are kept in reset state until after the filter coefficients of the adaptive filters are updated and the filter has settled. Thereafter the integrators are activated and a new adaptation cycle begins. The accuracy of the gradient estimate and hence the adaptation steady-state error is determined by the factor N, the number of samples included in one correlation. N>16000 leads typically to sufficiently small steady-state errors. For large input signals U, however, N has to be chosen up to 100 times bigger depending on the actual modulator configuration.

Other embodiments are within the spirit and scope of the appended claims.

What is claimed is:

1. A sigma-delta modulation system, comprising:

a sigma-delta modulator adapted for coupling to an input signal and a test signal; and an adaptive quantization noise canceler fed by the modulator for canceling quantization noise generated in the modulator in accordance with test signal components in a quantization noise compensated output signal produced by the adaptive quantization noise canceler.

2. The sigma-delta modulation system of claim 1 wherein the adaptive quantization noise canceler includes:

an adaptive filter fed by the modulator; and, a test signal detector fed by the quantization noise compensated output signal; and wherein the characteristics of the adaptive filter are modified by the test signal detector to remove quantization noise from the modulator output signal.

3. A method for operating a sigma-delta modulation system comprising the steps of:

feeding an input signal and a test signal into different inputs of a sigma-delta modulator, such modulator providing a common filter for a composite signal comprising the test signal and quantization noise generated in the modulator, such modulator producing an output signal comprising a quantized input signal and the commonly filtered composite signal;

feeding the modulator output signal to an adaptive quantization noise canceler, such canceler combining the modulator output signal with a quantization noise nulling signal to produce a quantization noise compensated output signal.

4. The method recited in claim 3 including the step of producing the quantization noise nulling signal by detecting the test signal component in the quantization noise compensated output signal and modifying the composite signal, also fed to the adaptive quantization noise canceler, in accordance with detected test signal in a feedback loop to null the test signal component in the quantization noise compensated output signal.

5. A method for operating a sigma-delta modulation system, comprising the steps of:

concurrently feeding an input signal and a test signal to the sigma-delta modulator to produce a modulator output signal, the modulator providing a common filter for a composite signal comprising the test signal and quantization noise generated in the modulator, the modulator output signal produced therefore includes as components thereof the quantized input signal and the filtered composite signal;

combining the modulator output signal and the prefiltered composite signal in an adaptive quantization noise canceler producing a quantization noise nulling signal.

6. The method recited in claim 5 wherein the quantization noise nulling signal is produced by detecting the test signal component in the quantization noise compensated output signal and modifying the composite signal, also fed to the adaptive quantization noise canceler, in accordance with detected test signal in a feedback loop which nulls the test signal component in the quantization noise compensated output signal.

7. A sigma-delta modulation system, comprising:

a sigma-delta modulator adapted for having concurrently fed thereto an input signal and a test signal, such modulator providing a common filter for the test signal and quantization noise generated in the modulator in quantizing the input signal, such modulator producing an output signal comprising the quantized input signal and the commonly filtered quantization noise and test signal; and an adaptive quantization noise canceler for combining the quantization noise and test signal prior to filtering by the common filter with the modulator output signal to produce a quantization noise compensated output signal, such canceler combines the quantization noise and test signal prior to filtering by the common filter and the modulator output signal as a function of the power of the test signal in the quantization noise compensated output signal.

8. A method for operating a sigma-delta modulator comprising the steps of:

concurrently feeding an input signal and a test signal to the modulator to produce an output signal, such modulator providing a common filter for the test signal and quantization noise generated in the modulator, such output signal comprising the quantized input signal and the commonly filtered quantization noise and test signal;

combining the quantization noise and test signal prior to filtering by the common filter with the output signal to produce a corrected output signal, the quantization noise and test signal, prior to filtering by the common filter, and the output signal being combined as a function of the power of the test signal in the corrected output signal.

9. A sigma-delta modulation system, comprising:

a sigma-delta modulator concurrently fed by an input signal and a test signal to produce an output signal, such modulator providing a common filter for the test signal and quantization noise generated in the modulator in quantizing the input signal, such output signal comprising the quantized input signal and the commonly filtered quantization noise and test signal;

a combiner for combining the quantization noise and test signal prior to filtering by the common filter with the output signal to produce an corrected output signal, the quantization noise and test signal prior to filtering by the common filter and the output signal being combined as a function of the power of the test signal in the corrected output signal.

10. A method for operating a sigma-delta modulator, comprising the steps of:

concurrently feeding an input signal and a test signal to the modulator to produce a primary modulator output signal, such modulator providing a common filter for a composite signal comprising the test signal and quantization noise generated in the modulator;

combining the composite signal with the modulator output signal in accordance with an estimate of the characteristics of the common filter to produce a pre-corrected output signal; and combining the modulator output signal and the composite signal to produce a corrected output signal, such signals being combined as a function of the power of the test signal in the corrected output signal.

11. A sigma-delta modulation system, comprising:

a sigma-delta modulator adapted for having concurrently fed thereto an input signal and a test signal to the modulator to produce a primary modulator output signal, such modulator providing a common filter for a composite signal comprising the test signal and quantization noise generated in the modulator;

a first combiner for combining the composite signal with the modulator output signal in accordance with an estimate of the characteristics of the common filter to produce a pre-corrected output signal; and a second combiner for combining the modulator output signal and the composite signal to produce a corrected output signal, such second combiner combining such signals as a function of the power of the test signal in the corrected output signal.

12. A method for operating a sigma-delta modulator comprising the steps of:

concurrently feeding an input signal and a test signal to the modulator to produce an output signal;

correlating the output signal with the injected test signal to produce an error correction signal;

modifying the output signal in accordance with the produced error correction signal.

13. A method for operating a sigma-delta modulator having a feedback loop filter fed by an input signal fed to the modulator for quantization by the modulator and by an output signal produced by the modulator; and a quantizer fed by the feedback loop filter to produce the modulator output signal, comprising the steps of:

introducing a test signal into the quantizer;

correlating the output signal with the injected test signal to produce an error correction signal;

modifying the output signal in accordance with the produced error correction signal.

14. The method recited in claim 13 wherein the input signal and the test signal are fed to the modulator concurrently.

* * * * *